United States Patent
Aruga

(10) Patent No.: US 10,136,108 B2
(45) Date of Patent: Nov. 20, 2018

(54) IMAGING DEVICE

(71) Applicant: NIKON CORPORATION, Tokyo (JP)

(72) Inventor: Yuki Aruga, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/684,474

(22) Filed: Aug. 23, 2017

(65) Prior Publication Data

US 2017/0353700 A1 Dec. 7, 2017

Related U.S. Application Data

(63) Continuation of application No. 14/903,196, filed as application No. PCT/JP2014/067886 on Jul. 4, 2014.

(30) Foreign Application Priority Data

Jul. 8, 2013 (JP) ................................. 2013-142761

(51) Int. Cl.
*H04N 9/04* (2006.01)
*H04N 5/378* (2011.01)
*H01L 27/146* (2006.01)

(52) U.S. Cl.
CPC ....... *H04N 9/045* (2013.01); *H01L 27/14621* (2013.01); *H01L 27/14645* (2013.01); *H04N 2209/046* (2013.01)

(58) Field of Classification Search
CPC .............. H04N 9/045; H04N 2209/046; H01L 27/14645; H01L 27/14621
See application file for complete search history.

(56) References Cited

U.S. PATENT DOCUMENTS

| | | | |
|---|---|---|---|
| 9,184,198 B1 * | 11/2015 | Miao | H01L 27/14634 |
| 2003/0160157 A1 | 8/2003 | Baharav et al. | |
| 2004/0196395 A1 * | 10/2004 | Lee | H04N 9/045 |
| | | | 348/272 |
| 2007/0127095 A1 | 6/2007 | Sugimori | |
| 2007/0237512 A1 | 10/2007 | Kusaka | |
| 2008/0174701 A1 * | 7/2008 | Iketani | A61B 1/05 |
| | | | 348/687 |
| 2008/0246853 A1 | 10/2008 | Takizawa et al. | |
| 2008/0259192 A1 | 10/2008 | Choe et al. | |

(Continued)

FOREIGN PATENT DOCUMENTS

| | | |
|---|---|---|
| EP | 1903766 A2 | 3/2008 |
| JP | 2003-298039 A | 10/2003 |

(Continued)

OTHER PUBLICATIONS

Sep. 22, 2015 International Search Report issued in International Patent Application No. PCT/JP2014/067886.

(Continued)

*Primary Examiner* — Roberto Velez
*Assistant Examiner* — Tuan Le
(74) *Attorney, Agent, or Firm* — Oliff PLC

(57) ABSTRACT

An imaging device includes a plurality of first pixels that includes pixels of a plurality of color components and generates a first signal from incident light, a plurality of second pixels that generates a second signal from light that has transmitted at least a part of the first pixels, and a signal generation unit that generates a signal obtained by combining the first signal and the second signal.

7 Claims, 6 Drawing Sheets

OUTPUT FROM UPPER PHOTOELECTRIC CONVERSION LAYER 31

OUTPUT FROM LOWER PHOTOELECTRIC CONVERSION LAYER 32

BRIGHTNESS SIGNAL

| r | g | r | g |
|---|---|---|---|
| g | b | g | b |
| r | g | r | g |
| g | b | g | b |

+

| w | w | w | w |
|---|---|---|---|
| w | w | w | w |
| w | w | w | w |
| w | w | w | w |

=

| Y | Y | Y | Y |
|---|---|---|---|
| Y | Y | Y | Y |
| Y | Y | Y | Y |
| Y | Y | Y | Y |

(56) References Cited

U.S. PATENT DOCUMENTS

| | | |
|---|---|---|
| 2009/0285476 A1 | 11/2009 | Choe et al. |
| 2010/0026865 A1 | 2/2010 | Tivarus et al. |
| 2010/0141771 A1* | 6/2010 | Hu .................... H01L 27/14621 348/164 |
| 2012/0193689 A1 | 8/2012 | Park et al. |
| 2013/0057699 A1 | 3/2013 | Ooki |
| 2013/0075607 A1 | 3/2013 | Bikumandla et al. |
| 2013/0182173 A1 | 7/2013 | Murata |
| 2013/0234029 A1 | 9/2013 | Bikumandla |
| 2014/0306276 A1 | 10/2014 | Yamaguchi |

FOREIGN PATENT DOCUMENTS

| | | |
|---|---|---|
| JP | 2007-282109 A | 10/2007 |
| JP | 2008-258474 A | 10/2008 |
| JP | 2009-130239 A | 6/2009 |
| JP | 2013-070030 A | 4/2013 |
| WO | 2012/028847 A1 | 3/2012 |
| WO | 2012/169127 A1 | 12/2012 |

OTHER PUBLICATIONS

Sep. 23, 2016 Office Action issued in U.S. Appl. No. 14/903,196.
Nov. 22, 2016 Office Action issued in Japanese Patent Application No. 2013-142761.
Nov. 10, 2016 Office Action issued in Chinese Patent Application No. 201480049327.6.
Feb. 1, 2017 Search Report issued in European Patent Application No. 14823363.8.
May 23, 2017 Office Action issued in U.S. Appl. No. 14/903,196.
May 22, 2018 Office Action issued in Japanese Application No. 2017-088618.
Apr. 3, 2018 Office Action issued in European Application No. 14 823 363.8.

* cited by examiner

FIG.3

ARRANGEMENT OF PIXELS OF
UPPER PHOTOELECTRIC
CONVERSION LAYER 31

| | 1 | 2 | 3 | 4 | 5 | 6 |
|---|---|---|---|---|---|---|
| 1 | R | G | R | G | R | G |
| 2 | G | B | G | B | G | B |
| 3 | R | G | R | G | R | G |
| 4 | G | B | G | B | G | B |
| 5 | R | G | R | G | R | G |
| 6 | G | B | G | B | G | B |
| 7 | R | G | R | G | R | G |
| 8 | G | B | G | B | G | B |
| 9 | R | G | R | G | R | G |
| 10 | G | B | G | B | G | B |

(a)

ARRANGEMENT OF PIXELS OF
LOWER PHOTOELECTRIC
CONVERSION LAYER 32

(b)

IMAGING DEVICE

PRIORITY CLAIM

This is a Continuation of U.S. application Ser. No. 14/903, 196 filed Apr. 29, 2016, which is a National Stage Entry of International Application No. PCT/JP2014/067886 filed Jul. 4, 2014, which claims the benefit of priority to Japanese Application No. 2013-142761 filed Jul. 8, 2013. The disclosure of the prior applications are hereby incorporated by reference herein in their entirety.

TECHNICAL FIELD

The present invention relates to an imaging device.

BACKGROUND ART

An image sensor with color filters has been known in the art (refer to PTL 1).

CITATION LIST

Patent Literature

PTL1: Japanese Laid Open Patent Publication No. 2007-282109

SUMMARY OF INVENTION

Technical Problem

In the conventional technology, light that has transmitted through a corresponding color filter is input into each pixel. Thus, for instance, in a G pixel that receives G (green) light, light other than the G light is absorbed by the color filter and is not used. Furthermore, in the G pixel not all of the light is used; a part of the G light is absorbed or reflected by the color filter. In this manner, the conventional technology has manifested a poor use efficiency of incident light.

Solution to Problem

An imaging device according to a first aspect of the present invention comprises: a plurality of first pixels that includes pixels of a plurality of color components and generates a first signal from incident light; a plurality of second pixels that generates a second signal from light that has transmitted at least a part of the first pixels; and a signal generation unit that generates a signal obtained by combining the first signal and the second signal.

According to a second aspect of the present invention, in the imaging device according to the first aspect, it is preferable that the first pixels photoelectrically convert light of a specific color component out of incident light to generate the first signal and transmit light of any color component other than the specific color component; and the signal generation unit adds the first signal to the second signal to generate a brightness signal.

According to a third aspect of the present invention, in the imaging device according to the second aspect, it is preferable that the first pixels include a pixel that photoelectrically converts light of a first color component, a pixel that photoelectrically converts light of a second color component, and a pixel that photoelectrically converts light of a third color component; and the signal generation unit generates a color difference signal by using the first signal.

According to a fourth aspect of the present invention, it is preferable that the imaging device according to the third aspect, it is preferable that the signal generation unit performs color interpolation processing at a position of each pixel by using the first signal to obtain signals of the first to the third color components, obtains image signals of the first to the third color components based on a ratio of the signals of the first to the third color components and on the brightness signal, and generates the color difference signal based on the obtained image signals or based on the obtained image signals and the brightness signal.

According to a fifth aspect of the present invention, in the imaging device according to the third or fourth aspect, it is preferable that the first color component is red, the second color component is green, and the third color component is blue; and the first pixels are arranged in a Bayer array.

An imaging device according to a sixth aspect of the present invention comprises: an image sensor having a first photoelectric conversion layer, at which pixels that photoelectrically convert light of a specific color component of incident light and transmit light of any color component other than the light of the specific color component of the incident light are two-dimensionally arrayed, and a second photoelectric conversion layer arranged as stacked in a same optical path as that of the first photoelectric conversion layer, at which pixels that photoelectrically convert the light that has transmitted through the first photoelectric conversion layer are two-dimensionally arrayed; and an image generation unit that generates a color image signal by using an output signal from the first photoelectric conversion layer and an output signal from the second photoelectric conversion layer, wherein: the image generation unit adds the output signal from the first photoelectric conversion layer to the output signal from the second photoelectric conversion layer to generate a brightness signal in the color image signal.

According to a seventh aspect of the present invention, in the imaging device according to the sixth aspect, it is preferable that the first photoelectric conversion layer has a first pixel that photoelectrically converts light of a first color component, a second pixel that photoelectrically converts light of a second color component, and a third pixel that photoelectrically converts light of a third color component; and the image generation unit generates a color difference signal in the color image signal by using the output signal from the first photoelectric conversion layer.

According to an eighth aspect of the present invention, in the imaging device according to the seventh aspect, it is preferable that the image generation unit performs color interpolation processing at each pixel of the image sensor by using the output signal from the first photoelectric conversion layer to acquire signals of the first to the third color components, acquires image signals of the first to the third color components based on a ratio of the signals of the first to the third color components and on the brightness signal, and generates the color difference signal based on the image signals or based on the image signals and the brightness signal.

According to a ninth aspect of the present invention, in the imaging device according to the seventh or eighth aspect, it is preferable that the first color component is red, the second color component is green, and the third color component is blue; and the first to the third pixels are arranged in a Bayer array.

Advantageous Effects of Invention

According to the present invention, the use efficiency of incident light can be improved.

BRIEF DESCRIPTION OF DRAWINGS

FIG. 3 shows diagrams illustrating an example of the arrangement of pixels.

DESCRIPTION OF EMBODIMENTS

Figure 1:
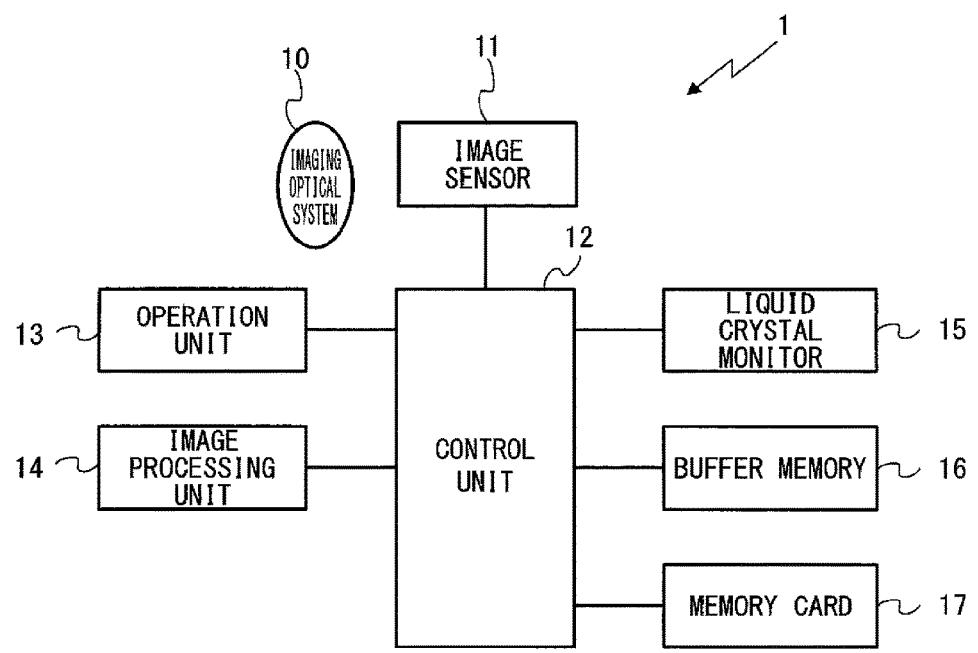
FIG. 1 is a block diagram illustrating an example of the arrangement of a digital camera.

Hereafter, an embodiment of the present invention is explained with reference to the drawings. FIG. 1 is a diagram illustrating the configuration of a digital camera 1 according to an embodiment of the present invention. The digital camera 1 includes an imaging optical system 10, an image sensor 11, a control unit 12, an operation unit 13, an image processing unit 14, a liquid crystal monitor 15, and a buffer memory 16. The digital camera 1 is equipped with a memory card 17.

The control unit 12, which includes a microprocessor and peripheral circuits, executes a control program stored at a ROM (not shown in figures) to perform various types of controls of the digital camera 1.

The image sensor 11, which includes a plurality of pixels, receives a light flux from a subject via the imaging optical system 10 and performs photoelectrical conversion to output an analog image signal or a digital image signal. If an analog image signal is output from the image sensor 11, the analog image signal is AD-converted by an AD conversion circuit (not shown in figures) to generate a digital image signal. The digital image signal is store d at the buffer memory 16.

The digital image signal stored at the buffer memory 16 is subjected to various types of image processing at the image processing unit 14. The resultant signal is displayed at the liquid crystal monitor 15 or stored at the memory card 17. The memory card 17 is constituted by a non-volatile flash memory or the like and is capable of being attached to and detached from the digital camera 1.

The operation unit 13, which includes various types of operation buttons such as a release button, a forward-reverse button, and a power button, is operated by a photographer. The operation unit 13 outputs an operation signal in response to the operation of each operation button by the photographer to the control unit 12. The image processing unit 14 includes, for instance, an application specific integrated circuit (ASIC). The image processing unit 14 performs various types of image processing such as interpolation, compression, and white balance adjustment as well as the image generation processing described later on the image data captured by the image sensor 11.

<Explanation on Image Sensor>

Figure 2:
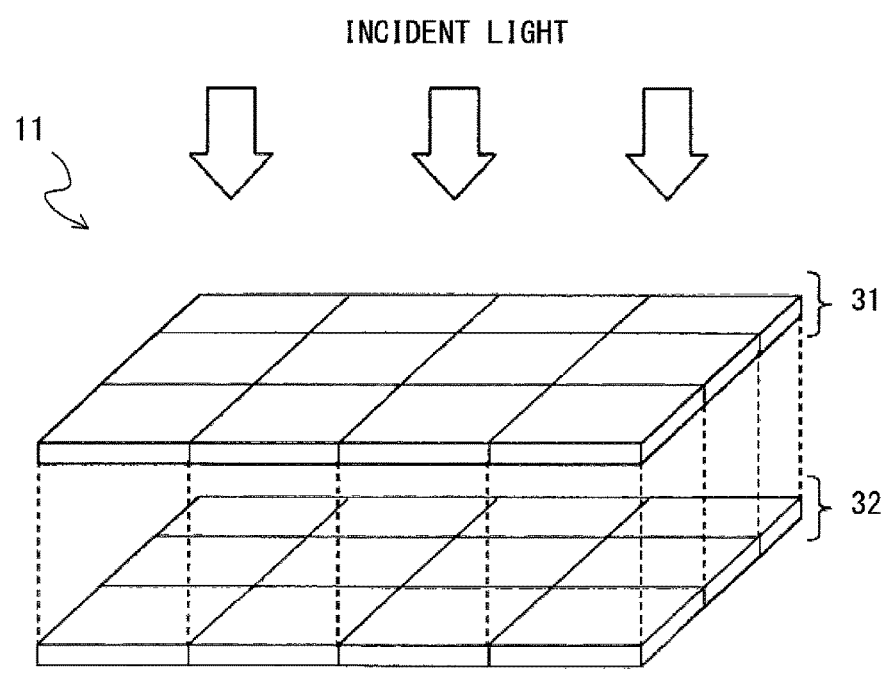
FIG. 2 is a schematic diagram illustrating an image sensor.

FIG. 2 is a schematic diagram illustrating the image sensor 11 according to this embodiment. FIG. 2 shows a state in which a side on which light is incident is defined to be upside. Accordingly, in the following explanation, a side in which the light is incident is defined to be "upper" or "up" and a side opposite to the side in which the light is incident is defined to be "lower" or "down". The image sensor 11 has an upper photoelectric conversion layer 31 and a lower photoelectric conversion layer 32. The upper photoelectric conversion layer 31 and the lower photoelectric conversion layer 32 are arranged as stacked one on another in the same optical path. The upper photoelectric conversion layer 31 is made of an organic photoelectric conversion layer that absorbs (photoelectrically converts) light of a specific color component (described later in detail). Light of any color component that is not absorbed (photoelectrically converted) by the upper photoelectric conversion layer 31 transmits through the upper photoelectric conversion layer 31 and enters the lower photoelectric conversion layer 32 to be photoelectrically converted at the lower photoelectric conversion layer 32. The lower photoelectric conversion layer 32 is made of an organic photoelectric conversion layer that absorbs (photoelectrically converts) light having all the wavelengths of the visible light. The upper photoelectric conversion layer 31 and the lower photoelectric conversion layer 32 are formed on one and the same semiconductor substrate and the positions of pixels in each layer correspond to each other one for one. For instance, the pixel at the first column in the first row of the upper photoelectric conversion layer 31 corresponds to the pixel at the first column in the first row of the lower photoelectric conversion layer 32.

FIG. 3(a) is a diagram illustrating the arrangement of the pixels of the upper photoelectric conversion layer 31. In FIG. 3(a), an axis in the horizontal direction is defined to be an x-axis and an axis in the vertical direction is defined to be a y-axis. The coordinates of a pixel P is expressed P(x, y). At the upper photoelectric conversion layer 31, the pixels are arranged, for instance, in a Bayer array. That is, as shown in FIG. 3(a), an R pixel that photoelectrically converts R (red) light and a G pixel that photoelectrically converts G (green) light are arranged alternately at an odd number row. At an even number row, a G pixel that photoelectrically converts G (green) light and a B pixel that photoelectrically converts B (blue) light are arranged alternately. Light of a color component that is not photoelectrically converted (absorbed) by each pixel of the upper photoelectric conversion layer 31 transmits through the upper photoelectric conversion layer 31. For instance, the pixel P(1, 1) of the upper photoelectric conversion layer 31 absorbs and photoelectrically converts the light of R component, so that the light of any color component other than the R component transmits through the upper photoelectric conversion layer 31.

FIG. 3(b) is a diagram illustrating the arrangement of the pixels of the lower photoelectric conversion layer 32. The position of each pixel as shown in FIG. 3(b) is the same as that in FIG. 3(a). For instance, the pixel P(1, 1) of the lower photoelectric conversion layer 32 corresponds to the pixel P(1, 1) of the upper photoelectric conversion layer 31. At the lower photoelectric conversion layer 32 are two-dimensionally arranged pixels that are capable of absorbing light having all the wavelengths of visible light. This causes each pixel of the lower photoelectric conversion layer 32 to absorb and photoelectrically convert all the visible light that is not absorbed by the upper photoelectric conversion layer 31 (that is, that transmits through the upper photoelectric conversion layer 31). Consequently, for instance, at the pixel P(1,1) of the lower photoelectric conversion layer 32, the visible light that is not absorbed at the pixel P(1, 1) of the upper photoelectric conversion layer 31, that is, the visible light that contains only the color components other than the R component is absorbed and photoelectrically converted.

<Image Generation Processing>

Now, explanation is made on image generation processing in which the signal output from the image sensor 11 mentioned above is used to generate a color image signal of a YCbCr format. First, explanation is made on a method for generating a Y signal (brightness signal) with reference to FIG. 4.

As mentioned above, at the image sensor 11, each pixel of the upper photoelectric conversion layer 31 absorbs light of one of the RUB components and each corresponding pixel of the lower photoelectric conversion layer 32 receives and photoelectrically converts light of the color component that transmits through (i.e., is not absorbed by) the upper photoelectric conversion layer 31. As a result, addition of the output signal from the upper photoelectric conversion layer 31 to the output signal of the lower photoelectric conversion layer 32 provides a signal generated by the photoelectric conversion of the visible light input to the image sensor 11 without any other processing, i.e., a white-and-black signal, which is identical with the output signal from the conventional image sensor provided with no color filter.

Figure 4:
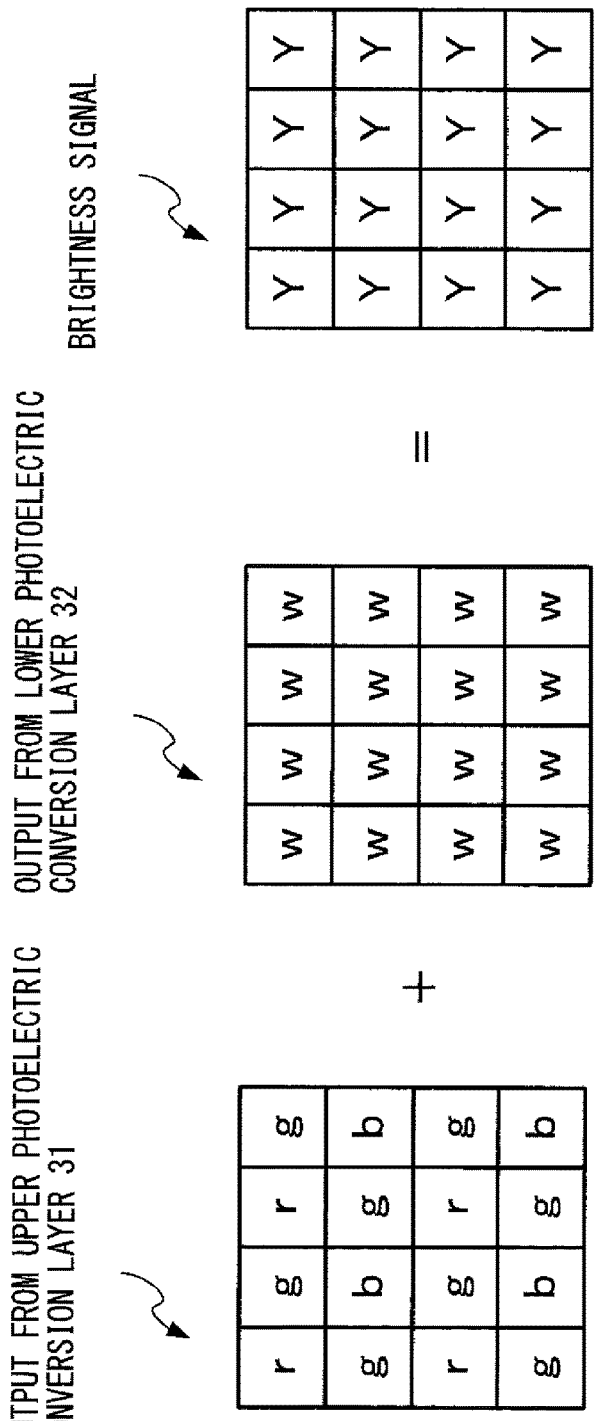
FIG. 4 is a diagram illustrating a method for generating a Y signal.

As shown in FIG. 4, the image processing unit 14 generates a Y signal (brightness signal) by adding the output signal from the upper photoelectric conversion layer 31 to the output signal from the lower photoelectric conversion layer 32 at the position of each pixel. In FIG. 4, r represents an output signal from an R pixel in the upper photoelectric conversion layer 31, g represents an output signal from a G pixel in the upper photoelectric conversion layer 31, and b represents an output signal from a B pixel in the upper photoelectric conversion layer 3L Further, w represents an output signal from a pixel arranged at the lower photoelectric conversion layer 32, which pixel absorbs the light having all the wavelengths of visible light. The image processing unit 14 obtains a Y signal according to the expression (1) below at the position of an R pixel, according to the expression (2) below at the position of a G pixel, or according to the expression (3) below at the position of a B pixel. The image processing unit 14 normalizes the Y signal within the range of 0 to 1.

$$Y=r+w \quad (1)$$

$$Y=g+w \quad (2)$$

$$Y=b+w \quad (3)$$

Figure 5:
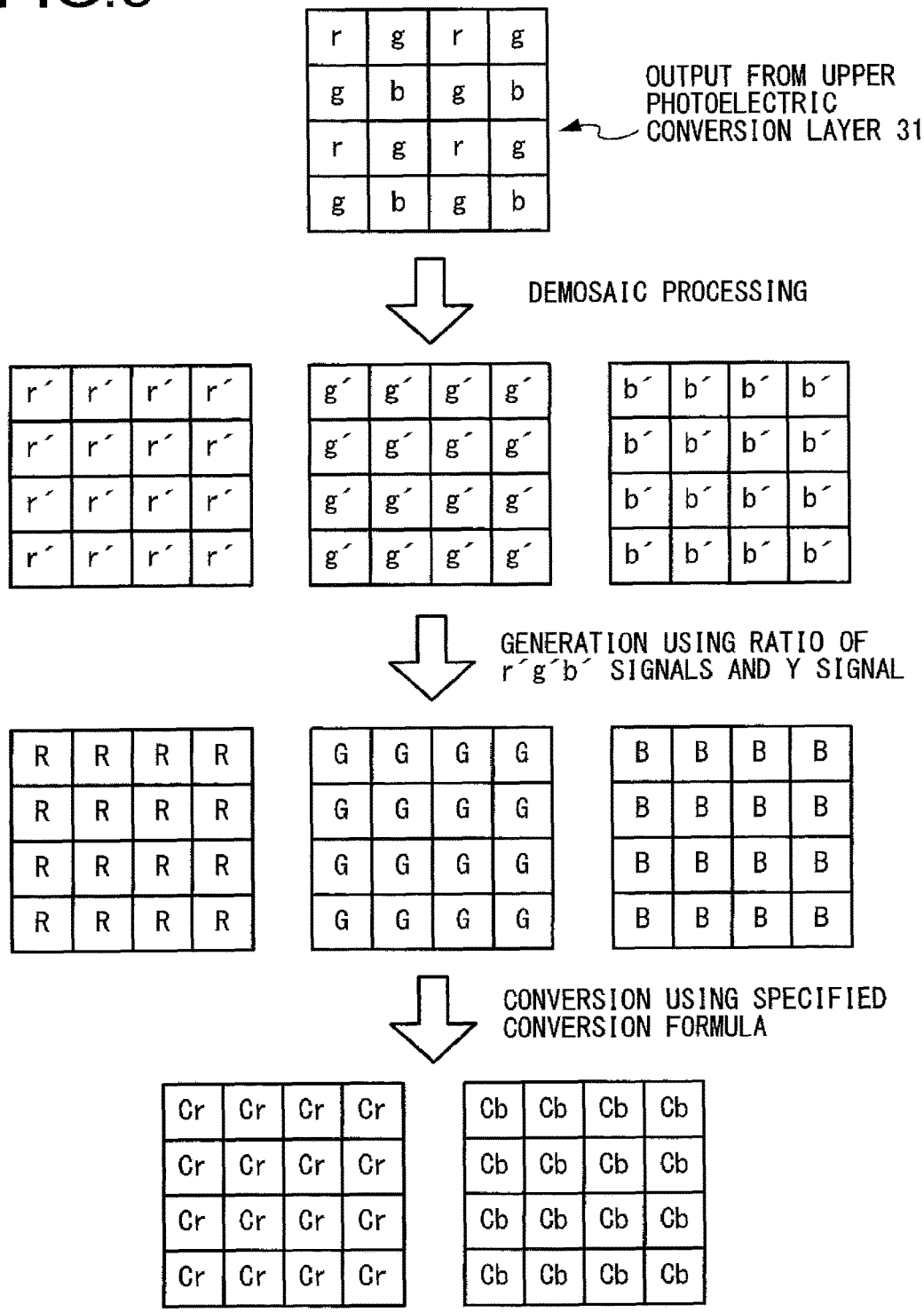
FIG. 5 is a diagram illustrating a method for generating Cb and Cr signals.

Now, explanation is made on a method for generating Cb and Cr signals (color difference signals) in the color image signal according to the process as illustrated in FIG. 5. First, the image processing unit 14 performs demosaic processing (color interpolation processing) while performing matrix conversion for adjusting white balance or spectrum on an image signal of a Bayer array output from the upper photoelectric conversion layer 31 to obtain respective signal values of the R component, the G component, and the B component for each pixel. Hereafter, the signal of R component generated by demosaic processing is expressed as r' signal, the signal of G component generated by demosaic processing is expressed as g' signal, and the signal of B component generated by demosaic processing is expressed as b' signal. The image processing unit 14 normalizes the r' signal, the g' signal, and the b' signal each within the range of 0 to 1.

Then, the image processing unit 14 acquires R, G, and B signals as color image signals by using the Y signal and the r', g', and b' signals obtained by the demosaic processing. First, explanation is made on acquisition of an R signal for the color image signal. In this embodiment, for instance, a relational expression for SDTV prescribed in ITU-R BT.601 Standard as shown by the expression (4) below is used.

$$Y=0.299R+0.587G+0.114B \quad (4)$$

If it is assumed that the ratio of the R signal, the G signal, and the B signal in the color image signal is identical with the ratio of the r signal, the g signal, and the b signal obtained by the above-mentioned demosaic processing (that is, R:G:B=r':g':b'), the following expressions (5) and (6) are given.

$$G=(g'\div r')R \quad (5)$$

$$B=(b'\div r')R \quad (6)$$

Plugging in the expressions (5) and (6) for the expression (4) results in the following expression (7).

$$Y=0.299R+0.587R(g'\div r')+0.114R(b'\div r') \quad (7)$$

Transformation of the expression (7) results in the following expression (8).

$$R=\{r'\div(0.299r'+0.587g'+0.114b')\}Y \quad (8)$$

The image processing unit 14 plugs in the r', g', and b' signals generated by the demosaic processing and the Y signal for the expression (8) to acquire an R signal in the color image signal.

Similarly, the image processing unit 14 plugs in the r', g', and b' signals generated by the demosaic processing and the Y signal for the following expressions (9) and (10) to acquire the U signal and B signal in the color image signal. The expressions (9) and (10) are prepared in the same manner as that for the R signal mentioned above.

$$G=\{g'\div(0.299r'+0.587g'+0.114b')\}Y \quad (9)$$

$$B=\{b'\div(0.299r'+0.587g'+0.114b')\}Y \quad (10)$$

As mentioned above, the image processing unit 14 acquires R, G, and B signals in the color image signal by using the ratio of the r' signal, the g' signal and the b' signal and the Y signal.

And the image processing unit 14 plugs in the R, G, and B signals calculated according to the expressions (8) to (10) for the following expressions (11) and (12) to acquire a Cr signal and a Cb signal. The expressions (11) and (12) are relational expressions for SDTV prescribed by the ITU-R BT.601 Standard.

$$Cr=0.500R-0.419G-0.081B \quad (11)$$

$$Cb=-0.168R-0.331G+0.500B \quad (12)$$

The image processing unit 14 may be configured to plug in the Y signal, the R signal, and the B signal for the following expressions (13) and (14) to acquire a Cr signal and a Cb signal. Also, the expressions (13) and (14) are relational expressions for SDTV prescribed by the ITU-R BT.601 Standard.

$$Cr=0.713(R-Y) \quad (13)$$

$$Cb=0.564(B-Y) \quad (14)$$

As mentioned above, the image processing unit 14 uses the signals output from the upper photoelectric conversion layer 31 and the output from the lower photoelectric conversion layer 32 to generate color image signals of a YCbCr format.

According to the above-explained embodiment, the following operations and advantageous effects can be obtained.

(1) digital camera 1 includes the image sensor 11 having the upper photoelectric conversion layer 31 at which pixels that photoelectrically convert light of a specific color component of incident light and transmit light of any component other than the specific component of the incident light are two-dimensionally arrayed, and a lower photoelectric; conversion layer 32 arranged as stacked in the same optical path as that of the upper photoelectric conversion layer 31 at which pixels that photoelectrically convert light transmitted through the upper photoelectric conversion layer 31 are two-dimensionally arrayed; and the image processing unit 14 that generates a color image signal of a YChCr format by using an output signal from the upper photoelectric conversion layer 31 and an output signal from the lower photoelectric conversion layer 32. The image processing unit 14 adds the output signal from the upper photoelectric conversion layer 31 to the output signal from the lower photoelectric conversion layer 32 to generate a brightness signal (Y signal) in the color image signal. This enables the digital camera 1 according to this embodiment to have a use efficiency of incident light higher than that of the conventional technology and to have a higher signal output to increase the S/N ratio of the Y signal.

Figure 6:
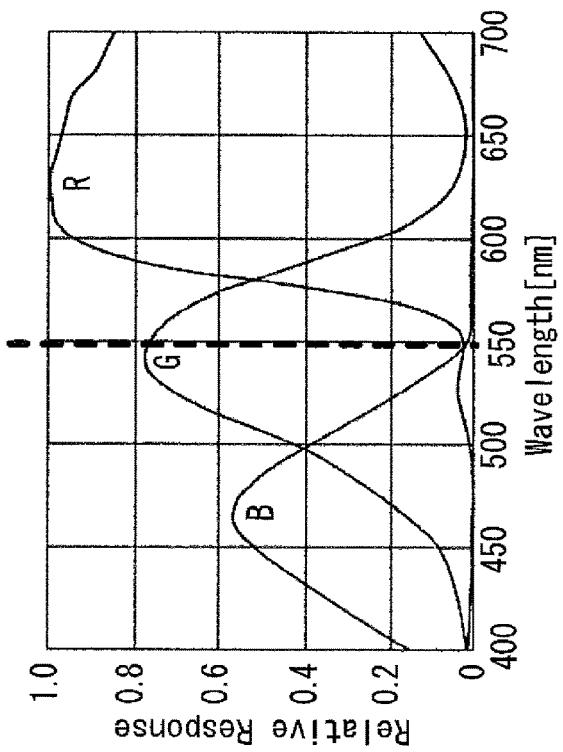
FIG. 6 shows diagrams illustrating an example of relative spectral response in an image sensor in which no color filters are arranged and in an image sensor in which color filters are arranged.
Figure 6:
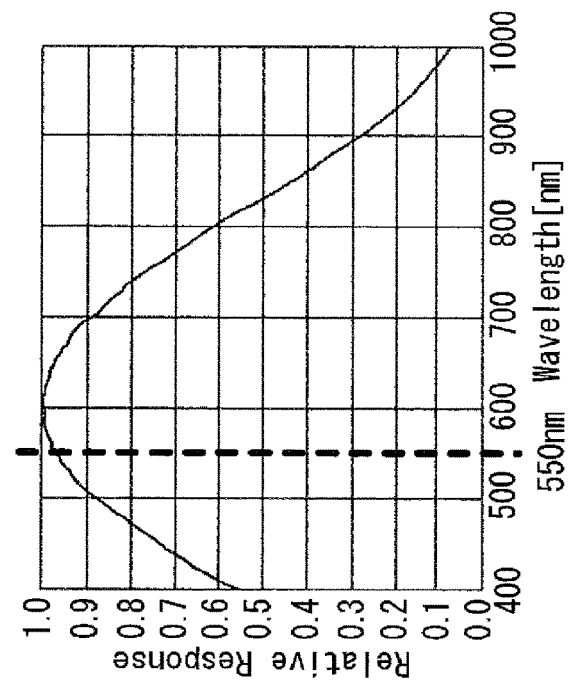

For reference, FIG. 6 shows examples of relative spectral response at conventional image sensors one having no color filters and the other having color filters arranged in a Bayer array in FIG. 6, the horizontal axis represents wavelength and the vertical axis represents output, with the peak output of each spectrum being normalized to 1. For instance, to focus on the spectrum near the wavelength of 550 nm, the G output from the image sensor having color filters arranged in a Bayer array is demonstrably lower than the output from the image sensor having no color filters. That is, at the image sensor having the color filters arranged in a Bayer array, not all the light is used even at a wavelength near the peak of G as compared with the image sensor having no color filters. Light having wavelength different from that of G is used in a considerably decreased ratio. As mentioned above, the image sensors having the conventional color filters manifest each a decreased use efficiency of light. In contrast, the digital camera 1 according to this embodiment is capable of using the light that is otherwise absorbed by color filters in the conventional image sensors. This enables the digital camera 1 to have a higher use efficiency of the incident light than that of the conventional digital camera.

(2) The image processing unit 14 in the digital camera 1 is configured to perform demosaic processing (color interpolation processing) at each pixel of the upper photoelectric conversion layer 31, thus generating r', g', and b' signals, to generate R, G, and B signals in the color image signal using the ratio of the r', g', and b' signals and Y signal, and to generate Cb and Cr signals according to predetermined conversion formulae (expressions (11) and (12)). Unlike the conventional image sensor in which the r', g', and b' signals obtained by demosaic processing are used as R, G, and B signals in the color image signal, this embodiment is arranged to use a Y signal to obtain R, G, and B signals in the color image signal. The reason for this is as follows.

For instance, the upper photoelectric conversion layer 31 is not capable of obtaining information about the G component and the B component at the position of the R pixel so that the respective signal values for the G component and the B component obtained by demosaic processing are values interpolated from the signal values of G pixel(s) and B pixel(s) near the R pixel. On the other hand, at the position of the R pixel in the upper photoelectric conversion layer 31, the output signal from the lower photoelectric conversion layer 32 contains information about the G component and the B component. Consequently, it is expected that use of the output signal from the lower photoelectric conversion layer 32 enables an image signal to have higher color reproducibility compared to the image signal obtained by demosaic processing. Accordingly, the digital camera 1 according to this embodiment is configured to use a Y signal obtained by adding the output signal from the upper photoelectric conversion layer 31 to the output signal from the lower photoelectric conversion layer 32 to obtain R, G, and B signals in the color image signal. This enables the image signal to have color reproducibility higher than the conventional technology.

VARIATION EXAMPLE 1

In the above-mentioned embodiment, explanation has been made on the example in which the ratio of r', g', and b' signals obtained by performing demosaic processing on the output signal from the upper photoelectric conversion layer 31 and Y signal are used to obtain R, G, and B signals in the color image signal and then obtain Cb and Cr signals. However, the r', g', and b' signal obtained by performing demosaic processing on the output signal from the upper photoelectric conversion layer 31 may be used as R, and B signals in the color image signal without further processing on them to generate Cb and Cr signals according to the expressions (11) and (12), or according to the expressions (13) and (14).

VARIATION EXAMPLE 2

In the above-mentioned embodiment, explanation has been made on the example in which the pixels are arranged in a Bayer array on the upper photoelectric conversion layer 31. However, the arrangement of the pixels is not limited to the Bayer array. In the above-mentioned embodiment, explanation has been made on the example in which the R pixel, the G pixel, and the B pixel are arranged in the upper photoelectric conversion layer 31. However, the arrangement of the pixels is not limited to that used in this example. For instance, a Cy pixel that receives Cy (cyan) light, an Mg pixel that receives Mg (magenta) light, and a Ye pixel that receives Ye (yellow) light may he arranged.

VARIATION EXAMPLE 3

In the above-mentioned embodiment, explanation has been made on the example in which the lower photoelectric conversion layer 32 is made of an organic photoelectric conversion layer. However, the lower photoelectric conversion layer 32 may be made of photodiodes.

In the above description, various embodiments and variation examples have been explained. However, the present invention is not limited to this. Other aspects or forms that can be conceived within the technical concept of the present invention are also included in the scope of the present invention.

The disclosure of the following priority application is herein incorporated by reference:

Japanese Patent Application No. 2013-142761 (filed on Jul. 8, 2013)

REFERENCE SIGNS LIST

1 . . . digital camera, 10 . . . imaging optical system, 11 . . . image sensor, 12 . . . control unit, 14 . . . image processing unit, 31 . . . upper photoelectric conversion layer, 32 . . . lower photoelectric conversion layer

The invention claimed is:

1. An imaging device, comprising:
an image sensor that comprises a first photoelectric converter that photoelectrically converts light having a component of a first color and generates photoelectric charges, a second photoelectric converter that photoelectrically converts light that has transmitted through the first photoelectric converter and generates photoelectric charges, a third photoelectric converter that photoelectrically converts light having a component of a second color different from the first color and generates photoelectric charges, and a fourth photoelectric converter that photoelectrically converts light that has transmitted through the third photoelectric converter and generates photoelectric charges; and
a generation unit that generates image data from (i) a first signal based on the photoelectric charges generated by the first photoelectric converter, (ii) a first addition signal obtained by adding the first signal to a second signal based on the photoelectric charges generated by the second photoelectric converter, (iii) a third signal based on the photoelectric charges generated by the third photoelectric converter, and (iv) a second addition signal obtained by adding the third signal to a fourth signal based on the photoelectric charges generated by the fourth photoelectric converter, wherein:
the first and third photoelectric converters are located in a first layer of the image sensor, and
the second and fourth photoelectric converters are located in a second layer of the image sensor that is different from the first layer.

2. The imaging device according to claim 1, wherein the generation unit generates the image data from a signal based on the first signal and the first addition signal.

3. The imaging device according to claim 1, wherein the light photoelectrically converted by the second photoelectric converter has a component of a complementary color of the first color.

4. The imaging device according to claim 1, wherein the generation unit generates the image data based on the first addition signal and a signal obtained by interpolating the first signal by using the third signal.

5. The imaging device according to claim 1, wherein the generation unit generates the image data based on the first signal, the third signal and the second addition signal.

6. The imaging device according to claim 1, wherein the generation unit generates the image data based on the second addition signal and a signal obtained by interpolating the third signal by using the first signal.

7. The imaging device according to claim 1, wherein the light photoelectrically converted by the fourth photoelectric converter has a component of a complementary color of the second color.

* * * * *